United States Patent [19]

Yau

[11] 3,997,367
[45] Dec. 14, 1976

[54] METHOD FOR MAKING TRANSISTORS

[75] Inventor: Leopoldo Dy Yau, New Providence, N.J.

[73] Assignee: Bell Telephone Laboratories, Incorporated, Murray Hill, N.J.

[22] Filed: Nov. 20, 1975

[21] Appl. No.: 633,602

[52] U.S. Cl. .............................. 148/1.5; 148/187; 156/17
[51] Int. Cl.² ..................................... H01L 21/265
[58] Field of Search ............. 148/1.5, 187; 156/17; 357/91

[56] References Cited
UNITED STATES PATENTS

| | | | |
|---|---|---|---|
| 3,592,707 | 7/1971 | Jaccodine | 148/187 X |
| 3,816,198 | 6/1974 | LaCombe et al. | 156/17 X |
| 3,890,176 | 6/1975 | Bolon | 156/17 X |

OTHER PUBLICATIONS

Archer, "Low Noise Implanted Base Microwave Transistors" Solid State Electronics, vol. 17, pp. 387–393, 1974.
Kamioka, et al., "A New Submicron Emitter Formation . . . etc.," IEDM Tech. Dig., pp. 279–282, 1974.

*Primary Examiner*—L. Dewayne Rutledge
*Assistant Examiner*—J. M. Davis
*Attorney, Agent, or Firm*—Lucian C. Canepa

[57] ABSTRACT

Submicron plasma trimming of a patterned resist material is combined with ion implantation techniques to achieve submicron control of lateral doping profiles. This makes possible the high-yield fabrication of, for example, bipolar microwave transitors of the self-aligned-emitter type. The basic technique can also be supplied to the fabrication of high performance insulted-gate field-effect transistors, junction-gate field-effect transistors and Schottky-barrier field-effect transistors.

12 Claims, 5 Drawing Figures

METHOD FOR MAKING TRANSISTORS

BACKGROUND OF THE INVENTION

This invention relates to the fabrication of semiconductor devices and, more particularly, to a technique for achieving submicron control of lateral doping profiles in such devices.

It is known to fabricate microwave bipolar transistors using the so-called self-aligned-emitter process, as described, for example, in "Low-Noise Implanted-Base Microwave Transistors" by J. A. Archer, *Solid State Electronics*, Vol. 17, pp. 387–393, 1974. To maximize the signal-to-noise ratio of such a transistor, the total base resistance of the unit must be reduced to a minimum while at the same time maintaining a sufficient current gain. In such a device, the base typically comprises inactive and active regions. The total base resistance is the sum of the resistances of these two base regions. To keep the current gain constant the resistance of the active base region can be reduced only by reducing the width of the emitter stripe of the device. The resistance of the inactive base region is reduced by establishing a relatively high doping concentration in that region.

In a typical self-aligned-emitter transistor as originally proposed, the emitter and inactive base regions are directly adjacent to each other. If the inactive base region is relatively heavily doped, its adjacency to the emitter which is also heavily doped gives rise to a so-called soft emitter-to-base junction which, for many applications of practical interest, is an undesirable feature of the device. (A soft junction is one that exhibits a relatively high leakage current and a relatively low breakdown voltage.)

One proposal for improving the characteristics of the emitter-to-base junction of a self-aligned-emitter transistor is to include in the device a so-called buffer base region. (See, for example, "A New Submicron Emitter Formation with Reduced Base Resistance for Ultra High Speed Devices" by H. Kamioka et al., *IEDM Technical Digest*, pp. 279–282, 1974.) This buffer portion is sandwiched between the relatively lightly doped active base region and the relatively heavily doped inactive base region. The impurity concentration in the buffer portion is typically intermediate those of the active and inactive base regions. Since the width of the buffer portion is typically very small (for example, less than 0.3 microns) its inclusion in the device does not contribute significantly to the total base resistance.

The technique described in the aforecited Kamioka et al. article for achieving a buffer base region in a self-aligned-emitter transistor has the disadvantage that it requires the controlled chemical etching of four deposited layers. In addition, an undercutting step of the type specified by Kamioka et al. has been found to be difficult to control in a predictable and reproducible way.

Accordingly, the need arose for a technique that would permit the formation of a buffer base region in a self-aligned-emitter transistor in a simple but easily reproducible manner. Moreover, it was recognized that such a technique if available would also be useful to control lateral doping profiles in a variety of other semiconductor devices.

SUMMARY OF THE INVENTION

Accordingly, a specific object of the present invention is an improved method for forming a buffer base region in a microwave bipolar transistor of the self-aligned-emitter type.

More generally, an object of this invention is a technique for controlling the lateral doping profile in a variety of semiconductor devices in a simple and reproducible manner.

Briefly, these and other objects of the present invention are realized in a specific illustrative method for fabricating a self-aligned-emitter bipolar transistor of the type that includes a submicron-wide buffer base region interposed between inactive and active base regions. In accordance with this method a layer of silicon nitride is formed on a silicon member of one conductivity type. A pattern of resist material is formed on the silicon nitride. Then, by a relatively high-dosage ion implantation, an inactive base region of the opposite conductivity type is established in the silicon member in regions not masked by the resist pattern. Next, in accordance with a main feature of the present invention, the resist material is trimmed by a predetermined amount in an oxidizing plasma. Those portions of the silicon nitride layer that are not masked by the trimmed resist are then etched away. Then, by a relatively low-dosage ion implantation, a region of the opposite conductivity type is established in the silicon member in regions not masked by the trimmed resist pattern thereby to form a buffer base region whose lateral extent corresponds to the predetermined amount trimmed from the resist. In a series of subsequent steps, active base and emitter regions are formed in the silicon member.

DETAILED DESCRIPTION OF THE DRAWING

For purposes of a specific example, the invention will be described herein in the context of making a particular microwave bipolar transistor of the self-aligned-emitter type. But as will be apparent later below, the invention is also applicable to the fabrication of other practical devices. Moreover, it is to be understood that the various specific dimensions, materials, concentrations, etc. specified below are illustrative only.

Figure 1:
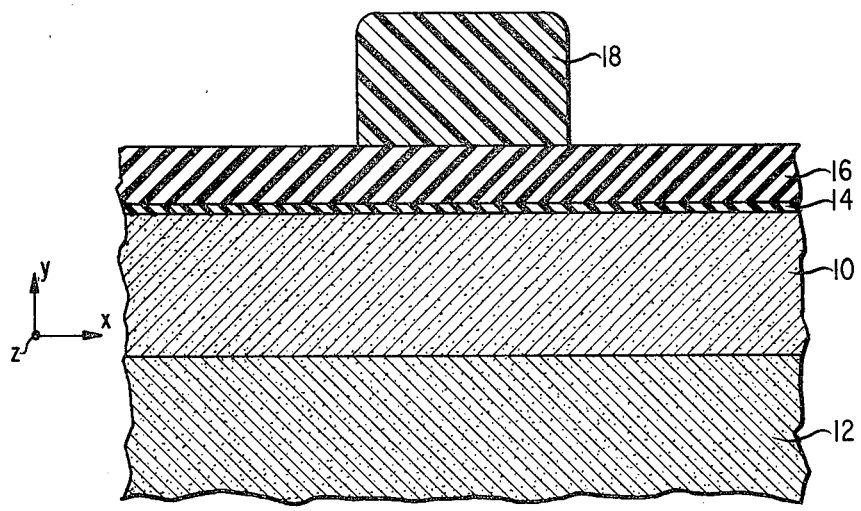
FIGS. 1 through 5 are cross-sectional side views of a portion of a specific illustrative semiconductor device of the type that may be made in accordance with the principles of the present invention.

In FIG. 1 a conventional epitaxial layer 10 is shown formed on an N-type silicon substrate 12. Illustratively, the layer 10 is 2.5 to 3.5 microns thick (in the y direction) and is arsenic doped to a concentration of about $5 \times 10^{15}$ arsenic atoms per cubic centimeter. Deposited on the layer 10 is a passivating layer 14 of, for example, silicon dioxide which is approximately 250 Angstroms thick. On top of the silicon dioxide is a layer 16 of silicon nitride about 1,000 Angstroms thick.

By conventional methods well known in the art, a layer of photo- or electron-resist material of either the positive or negative type is deposited on the layer 16 of FIG. 1 and then selectively irradiated and processed to form a prescribed pattern. Such a pattern is shown in FIG. 1 in the form of a bar 18 whose x, y and z dimensions are approximately 1.5 microns, 1 micron and 37 microns, respectively.

The resist bar or pattern 18 serves as a mask to prevent charged atoms (ions) directed at the top surface of the FIG. 1 structure from being injected into the portion of the epitaxial layer 10 that lies under the resist pattern 18. Such injection or ion implantation, which is a well-known technique (see, for example, "Ion Implantation", by W. L. Brown and A. U. Mac Rae, *Bell Laboratories Record*, pp. 389, 394, November 1975) may be easily designed to penetrate the layers 16 and 14 and to modify the properties of specified portions of the layer 10. Alternatively, those portions of the layer 16 not covered by the resist pattern 18 may be removed before carrying out the ion implantation step.

Figure 2:
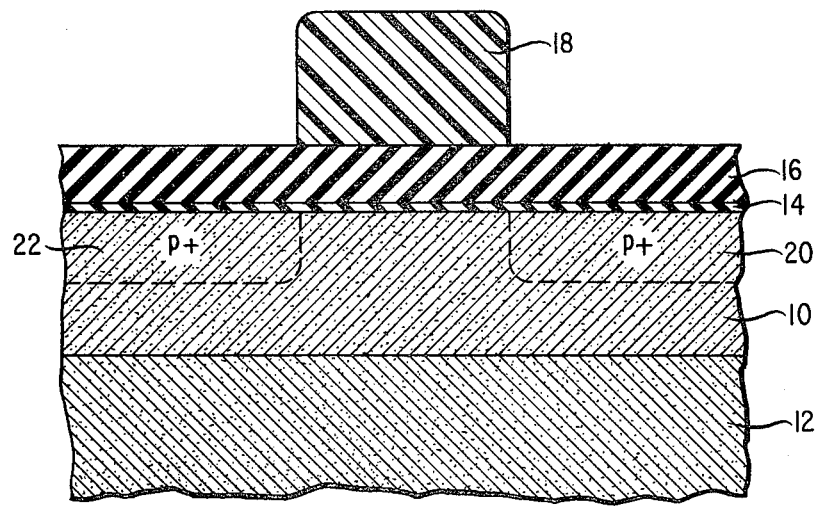

More specifically, as shown in FIG. 2, $P^+$ inactive base regions 20 and 22 are formed in the epitaxial layer 10 by conventional ion implantation techniques. Illustratively, the implantation of the regions 20 and 22 may be accomplished by directing a dose of $5 \times 10^{15}$ boron ions per square centimeter at an energy of 60,000 electron volts at the top surface of the FIG. 2 structure. Alternatively, by first removing those portions of the layer 16 not covered by the resist pattern 18, the regions 20 and 22 may be formed by ion implantation at the above-specified dose but at a reduced energy of only 20,000 electron volts. In either case this relatively high-dosage ion implantation step establishes in the layer 10 inactive base regions 20 and 22 that exhibit a relatively low resistance characteristic.

In accordance with the principles of the present invention, the next step in the fabrication process described herein is to trim the width of the resist pattern 18 of FIG. 2 by a predetermined amount. Advantageously, this is done by the technique known as plasma etching which is a simple dry process by means of which the desired trimming of the resist pattern may ordinarily be achieved in a matter of only several minutes. Plasma etching, which is a standard procedure well known in the art, is described, for example, in "A Plasma Oxidation Process For Removing Photoresist Films", by S. M. Irving, *Solid-State Technology*, Vol. 14(6), pp. 47–51, June 1971.

Illustratively, applicant's inventive method comprises trimming the resist pattern 18 of FIG. 2 in an oxidizing plasma. The trimming step may be carried out, for example, by utilizing an International Plasma Corporation Model 2005 plasma etching apparatus or other equivalent equipment. By placing the specimen to be etched, in an oxygen plasma at a pressure of about 1 torr, precisely-controlled submicron trimming of the resist material is achieved. At 40° C and at a power setting of 300 watts, a typical etch rate established in the apparatus for a negative resist material such as poly(glycidyl methacrylate-co-ethyl acrylate) (COP) was determined to be 0.1 microns per minute. Thus, to achieve an inactive buffer base region having a width of 0.2 to 0.5 microns, a total etching time in the range of only about 2 to 5 minutes is required.

Isotropic plasma etching of the resist material is carried out in the manner described above. After being trimmed by, for example 0.25 microns in both width and height, the resist pattern has the form shown in FIG. 3. The original resist pattern 18 is shown in dashed lines and the trimmed pattern is designated by reference numeral 24.

Figure 3:
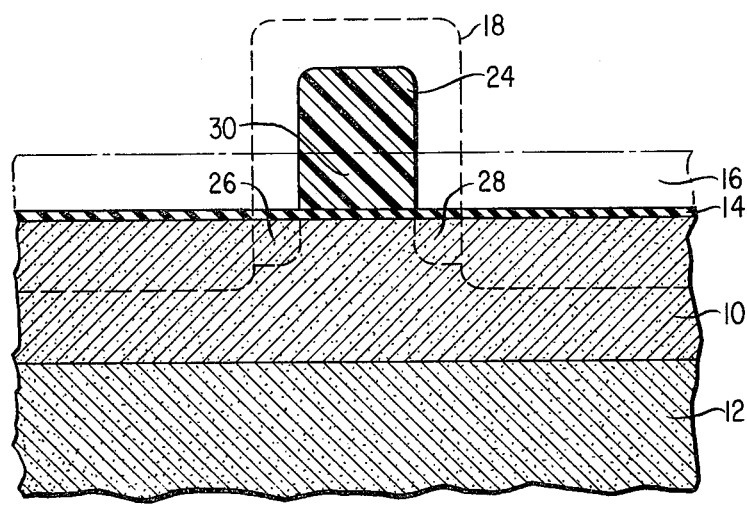

Before proceeding to ion implant the buffer base regions 26 and 28 shown in FIG. 3, it is advantageous but not absolutely necessary to remove those portions of the silicon nitride layer 16 that are not masked by the trimmed resist pattern 24. This may be done, for example, in a standard way in the aforementioned plasma etching apparatus in a differential etching step in which the unmasked portions of the layer 16 are attacked but in which the pattern 24 is left virtually intact. For example, by placing the FIG. 3 structure inside the radio-frequency shield of the aforedescribed plasma etching apparatus in a 0.5-torr atmosphere of 96 percent carbon fluoride and 4 percent oxygen, at a power setting of 100 watts, the unmasked portions of the silicon nitride layer 16 are removed. Typically, only 1 to 2 minutes are required for such removal. (The original top surface of the removed portions of the layer 16 is indicated in FIG. 3 by dot-dash lines.) At that point in the fabrication process, only the resist pattern 24 and a silicon nitride portion 30 directly underlying the pattern 24 remain on the layer 14.

Figure 5:
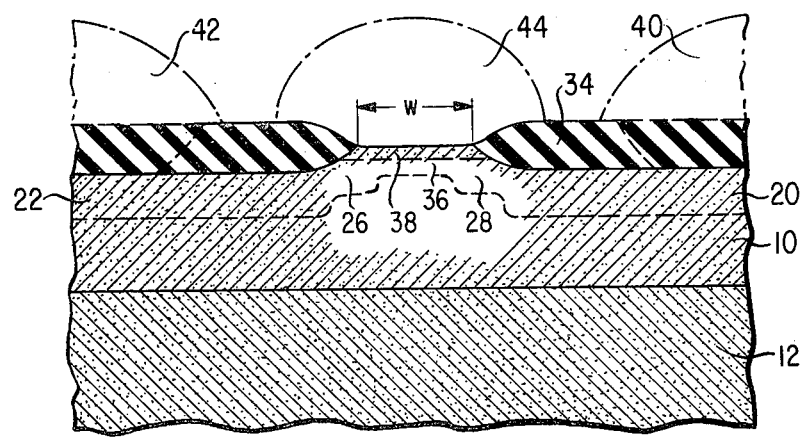

Next, the P-type buffer base regions 26 and 28 of FIG. 3 are formed by a boron implant at, for example, a dose of $1 \times 10^{14}$ ions per square centimeter at an energy of 10,000 electron volts. Alternatively, before forming the buffer regions 26 and 28, the resist material 24 may be removed from the silicon nitride region 30 by, for example, plasma etching or conventional wet chemical means. In that case, in a single ion implantation step both the buffer regions 26 and 28 and the active base region may be formed. This active base region, which is not shown in FIG. 3 but which will be further specified below and represented in FIG. 5, is formed under the region 30 in the layer 10 between the regions 26 and 28.

Assume, however, for purposes of a specific illustrative example that the resist 24 of FIG. 3 remains on the structure as a masking pattern and that therefore only the buffer regions 26 and 28 are formed by the above-described ion implantation step. Thereafter, the pattern 24 is removed in the manner specified above and a relatively thick layer of silicon dioxide is thermally grown in a conventional way on those portions of the original silicon dioxide layer 14 that are not masked by the silicon nitride portion 30. The resulting structure is shown in FIG. 4 wherein the silicon dioxide layer 32 has its original thickness of about 250 Angstroms directly under the silicon nitride portion 30 and a thickness $d$ of about 1500 Angstroms in other portions thereof.

During the entire processing cycle described above, particularly during the oxide-growing step, some lateral diffusion of the implanted P regions takes place. This has been represented in FIG. 4 by showing that the gap $g$ between the buffer base regions 26 and 28 is slightly less than the width of the portion 30. Additionally, the gap $h$ shown in FIG. 4 is slightly less than the idealized gap indicated in FIG. 2 as having been originally established between the regions 20 and 22.

In some fabrication procedures, the lateral movement of the facing boundaries of the originally formed regions 20 and 22 of FIG. 2 is exactly predictable and reproducible. In such cases, the above-described implant step that forms the buffer base regions 26 and 28 (see FIG. 3) may actually be eliminated. Lateral movement of some of the impurities originally implanted into the regions 20 and 22 will in effect form the relatively lightly-doped buffer regions. Regardless of the manner in which the buffer base regions are formed, the aforedescribed reduction in size of the resist pattern in accordance with the invention is controlled to achieve a trimmed resist pattern whose width approximates the final gap that exists between the facing boundaries of the buffer regions. Accordingly, in either case the width of the silicon nitride portion 30 shown in FIG. 4 will also approximate that gap.

Figure 4:
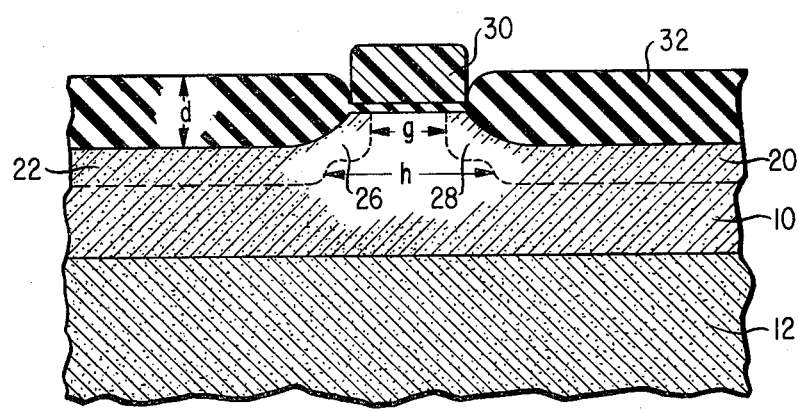

In a straightforward way, the silicon nitride portion 30 of FIG. 4 and the relatively thin layer of silicon dioxide directly thereunder are then etched away. Some part of the relatively thick layer 32 of silicon dioxide is also thereby etched but a substantial part of the layer 32 remains on the structure. This remaining part is shown in FIG. 5 and designated by reference numeral 34. A window or opening of width $w$ in the remaining layer 34 is available for successively implanting in the layer 10 self-aligned active base and emitter regions in a manner well known in the art. Illustratively, an active P-type base region 36 is implanted in the layer 10 by directing $5 \times 10^{13}$ boron ions per square centimeter at an energy of 3,000 electron volts through the window in the layer 34. Subsequently, to form an $N^+$-type emitter region 38, $2 \times 10^{15}$ arsenic ions per square centimeter at an energy of 50,000 electron volts are directed through the specified window. In addition, as is well known in the art, an annealing step may follow each of the base and emitter implanting steps thereby to relieve any crystal disorders in the layer 10 resulting from ion bombardment and, at the same time, to drive in (downwards in FIG. 5) the impurities in regions 36 and 38.

In FIG. 5 a portion of the buffer regions 26 and 28 is interposed between the emitter region 38 and the inactive base regions 20 and 22. For the reasons stated earlier above, such a structure, wherein the relatively heavily doped inactive base and emitter regions are separated by the relatively lightly-doped buffer regions, exhibits advantageous device characteristics.

Electrical contacts to the base and emitter regions of the structure shown in FIG. 5 are made in a conventional way. Thus, for example, openings (represented by dashed lines) may be made in the layer 34 and a suitable conductive material (represented by dot-dash lines) applied to the device to contact the inactive base regions 20 and 22. These conductive members in contact with the regions 20 and 22 are designated by reference numerals 40 and 42. Similarly, a conductive member 44 is formed on the structure to establish electrical contact with the emitter region 38. A suitable collector electrode connection may be made to the substrate 12.

Although emphasis above has been directed to applying applicant's inventive method to the fabrication of a self-aligned-emitter bipolar transistor, it is to be understood that the method is also applicable to making other types of devices.

In making an insulated-gate field-effect transistor (IGFET) device, a patterned layer of polysilicon covered by a correspondingly patterned layer of resist material may be utilized as a mask for implanting source and drain regions in a semiconductive body. During subsequent conventional processing steps, the vertical facing edges of the implanted regions tend in practice to move laterally toward each other. Accordingly, the polysilicon layer, which is intended to serve as the gate electrode of the device, overlies portions of the source and drain regions. This gives rise to undesirable parasitic capacitance effects which limit the high-frequency characteristics of the device and, in addition can cause low voltage punch-through on short-channel IGFETs.

In accordance with the principles of the present invention, the resist pattern on the polysilicon layer of a structure that is to be processed to form an IGFET device is initially made wider than the desired final width of the gate electrode. After plasma etching of the polysilicon that is not masked by the resist, source and drain regions are ion implanted in the device in a conventional way using the resist pattern and the remaining polysilicon as a composite mask member. Then the resist pattern is trimmed in the precisely controlled manner specified above to compensate for the expected lateral movement of the implanted source and drain regions. In other words, the resist is trimmed so that its width corresponds nearly exactly to the final spacing that will exist, after processing, between the facing edges of the source and drain regions. Next, by using the trimmed resist material as a mask, the exposed polysilicon is etched so that its width corresponds to that of the trimmed resist, whereby the width of the polysilicon is then less than the initial distance established between the implanted source and drain regions. Then the resist material is removed and the subsequent processing is carried out such that the final facing edges of the source and drain regions are nearly in exact alignment with the polysilicon gate. In this way an IGFET device having advantageous characteristics is easily and reproducibly achieved. Moreover, other devices such as, for example, Schottky-barrier FETs and junction-gate FETs may be constructed by following similar steps. In the Schottky-barrier and junction-gate FETs wherein the source and drain regions are typically heavily implanted to reduce resistance, a buffer region similar to that established in the above-described bipolar transistor process will avoid low voltage breakdown between the gate and the heavily implanted source and drain regions.

Finally, it is to be understood that the above-described procedures are only illustrative of the application of the principles of the present invention. In accordance with those principles, numerous modifications of the methods specified herein may be devised by those skilled in the art without departing from the spirit and scope of the invention. For example, although the main emphasis herein has been directed to trimming a resist material by the advantageous technique of plasma etching in an oxidizing atmosphere, it is to be understood that other techniques, for example wet chemical etching, are available as alternatives for carrying out the trimming step.

What is claimed is:

1. A method for making a semiconductor device comprising the steps of
    forming a prescribed resist pattern on a semiconductor body of one conductivity type,
    establishing regions of a specified conductivity type in portions of said body not masked by said resist pattern whereby said regions are spaced apart laterally in said body by a distance approximately equal to the width of said resist pattern,
    and trimming said resist pattern by a predetermined amount to reduce the width thereof thereby to provide a mask member for subsequent processing of said device.

2. A method for making a semiconductor device comprising the steps of
    forming a first layer on a semiconductor body of one conductivity type,
    forming a prescribed resist pattern on said first layer, establishing regions of a specified conductivity type in portions of said body not masked by said resist pattern whereby said regions are spaced apart laterally in said body by a distance approximately equal to the width of said resist pattern, trimming said resist pattern in an oxidizing plasma by a predetermined amount to reduce the width thereof, removing those portions of said first layer that are not masked by said trimmed resist pattern, and removing said resist pattern thereby leaving on said body a portion of said first layer whose width corresponds to the width of said trimmed resist.

3. A method as in claim 2 wherein said establishing step comprises ion implanting regions of the opposite conductivity type in said body.

4. A method as in claim 3 wherein the width of said resist pattern is trimmed by an amount that corresponds to the lateral movement of said implanted regions toward each other that occurs during fabrication of said device.

5. A method as in claim 4 wherein said first layer comprises a layer of silicon nitride.

6. A method as in claim 4 wherein said first layer comprises a layer of polysilicon.

7. A method as in claim 3 further including the step of ion implanting buffer regions in portions of said body not masked by said trimmed resist pattern.

8. A method as in claim 7 wherein said first layer comprises a layer of silicon nitride.

9. A method as in claim 8 further including the step of growing a layer of silicon dioxide on the surface portions of said device that are not covered by the remaining portion of silicon nitride.

10. A method as in claim 9 comprising the further step of removing said remaining portion of silicon nitride thereby to form a window in said silicon dioxide for access to said semiconductor body and then successively ion implanting through said window base and emitter regions in said body.

11. A method of fabricating a self-aligned-emitter bipolar transistor of the type that includes a submicron-wide buffer base region interposed between inactive and active base regions, said method comprising the steps of forming a first layer on a silicon member of one conductivity type, forming a pattern of resist material on said first layer, establishing by a relatively high-dosage ion implantation an inactive base region of the opposite conductivity type in said member in regions not masked by said resist pattern, laterally trimming said resist by a predetermined amount in an oxidizing plasma, removing those portions of the first layer that are not masked by said trimmed resist, establishing by a relatively low-dosage ion implantation a region of the opposite conductivity type in said member in regions not masked by said trimmed resist pattern thereby to form a buffer base region whose lateral extent corresponds approximately to the predetermined amount trimmed from said resist, removing said resist material, growing a second layer on all the surface portions of said silicon member except for the portion masked by the remaining portion of said first layer, removing the remaining portion of said first layer, and successively forming by ion implantation base and emitter regions in said silicon member in regions not masked by said second layer whereby said buffer base region is interposed between said inactive base region and said emitter region.

12. A method as in claim 11 wherein said first and second layers comprise layers of silicon nitride and silicon dioxide, respectively.

* * * * *